United States Patent [19]

Lee

[11] Patent Number: 5,702,964
[45] Date of Patent: Dec. 30, 1997

[54] METHOD FOR FORMING A SEMICONDUCTOR DEVICE HAVING A FLOATING GATE

[75] Inventor: Byung-Il Lee, Daejeon-si, Rep. of Korea

[73] Assignee: LG Semicon, Co., Ltd., Chungcheongbuk-do, Rep. of Korea

[21] Appl. No.: 544,317

[22] Filed: Oct. 17, 1995

[51] Int. Cl.[6] ............... H01L 21/265; H01L 21/8247
[52] U.S. Cl. .................................. 437/43; 437/52
[58] Field of Search ........................... 437/43, 52

[56] References Cited

U.S. PATENT DOCUMENTS

| | | | |
|---|---|---|---|
| 3,984,822 | 10/1976 | Simko et al. | 340/173 |
| 4,839,705 | 6/1989 | Tigelaar | 257/320 |
| 5,070,032 | 12/1991 | Yuan et al. | 437/43 |

Primary Examiner—John Niebling
Assistant Examiner—Richard A. Booth
Attorney, Agent, or Firm—Morgan, Lewis & Bockius LLP

[57] ABSTRACT

A method for forming of a semiconductor device having a transistor with a floating gate includes the steps of forming a first insulating layer and a first conductive layer on a surface of the substrate, patterning the first conductive layer on a cell forming area to form preliminary floating gate electrodes and implanting ions on the cell forming area, forming a second insulating layer on the resulting surface so that the second insulating layer fills a space between the preliminary floating gate electrodes, forming a third insulating layer on the resulting surface, forming a second conductive layer on the third insulating layer, forming a fourth insulating layer on the second conductive layer, forming a gate electrode by patterning the fourth insulating layer and the second conductive layer, wherein the gate electrode pattern has a first distance between the gate lines in a portion to be a contact hole, and a second distance between the gate lines is arranged in another portion, the first distance being wider than the second distance, and forming a floating gate electrode by patterning the third insulating layer and the second conductive layer.

20 Claims, 11 Drawing Sheets

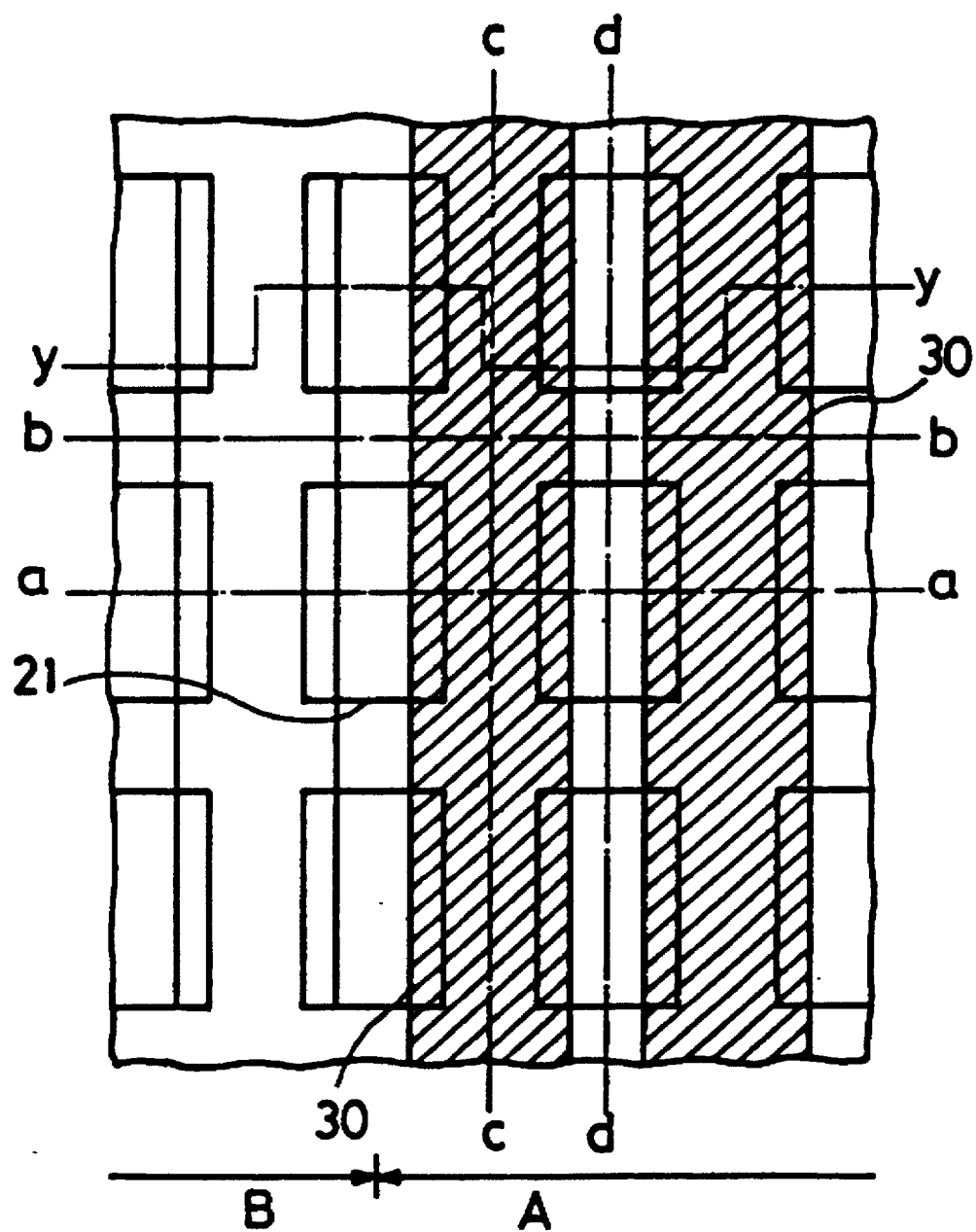

METHOD FOR FORMING A SEMICONDUCTOR DEVICE HAVING A FLOATING GATE

BACKGROUND OF THE INVENTION

1. Field of the Invention

The present invention relates to a method for forming a semiconductor memory device, and more particularly, to a method for forming a non-volatile semiconductor device using a floating gate electrode, such as an EPROM.

2. Discussion of the Related Art

Among semiconductor devices, a non-volatile semiconductor memory device, particularly a floating gate semiconductor memory device, includes peripheral circuits and memory cells which have a floating gate and a control gate. The gate electrode of the memory cell is formed of polysilicon doped with phosphorus or a similar impurity.

The floating gate is isolated from the substrate by a gate oxide layer, and the substrate region includes a source and a drain for forming a cell transistor. The floating gate and the control gate are insulated from each other by an insulating layer such as $SiO_2$.

The basic operating principle of the above semiconductor memory device using a floating polysilicon gate will now be described. A positive high voltage is supplied to a control gate electrode and a drain electrode, so that high energy electrons (hot electrons) produced near the drain electrode cross the potential barrier of the gate oxide layer, thereby injecting the electrons into the floating gate. Owing to the charges which are thus injected into the floating gate, the threshold value of the cell transistor is varied so as to be programmed. Meanwhile, if the floating gate is irradiated with ultraviolet rays, which have an energy higher than the potential barrier of the gate oxide layer, then the accumulated electrons in the floating gate return to the substrate, thereby erasing the programming. To erase the programmed state in some floating gate memory devices, a positive high voltage is applied to source and drain and a negative voltage is applied to the control gate electrode. Then, the electrons which accumulated in the floating gate are returned to the substrate, so that the programming state is erased.

In such a semiconductor device using a floating gate electrode, and particularly, in a non-volatile semiconductor memory device, a cell portion having floating gates and a related peripheral circuit portion are formed upon the same chip. Processes are carried out in such a manner that they should be formed simultaneously during a wafer process. Furthermore, the design of the layout is an important step in the formation process. A typical conventional process for forming them will now be described.

FIGS. 1a to 1h illustrate steps of a conventional process in which cells and MOS transistors in a peripheral circuit are simultaneously formed.

FIG. 1a shows a memory cell forming region A and a peripheral circuit forming region B. The memory cell forming region A includes cell elements for the semiconductor device using floating polysilicon gates, particularly, the non-volatile semiconductor memory device, while the peripheral circuit region B typically includes MOS transistors.

That is, as shown in FIG. 1a, an element isolating region 2 is formed upon a semiconductor substrate 1 so as to define a region for forming transistors of the memory cell and a region for forming a peripheral circuit.

Then, an insulating layer 10 is formed on the substrate. Next, a first polysilicon layer 3 is formed on the entire surface, so that floating gates for a non-volatile semiconductor memory device can be formed.

A dual stack layer for a gate electrode is not required in the peripheral circuit region, and therefore, the polysilicon layer 3 of the relevant region is removed using a photo etching process. As shown in FIG. 1b, the first polysilicon layer 3 is patterned.

A second polysilicon layer 4 is then formed on the entire substrate surface, so that the polysilicon layer would become control gates for the memory cells, and would become gate electrodes for the MOS transistors of the peripheral circuit region. Of course, they are used as word lines. In order to form these elements, an oxide layer 11 is formed upon the first polysilicon layer 3, and then, a second polysilicon layer 4 is formed on the oxide layer 11 as shown in FIG. 1c. Then the second oxide layer 5 is formed over the second polysilicon layer 4. Next, the second oxide layer 5 and the second polysilicon layer 4 are patterned as shown in FIG. 1d, thereby forming gate electrodes 13 and control electrodes 14.

Then, as shown in FIG. 1e, the peripheral circuit region is masked by a photoresist mask 6A, and then, an exposed dielectric layer portion 11 of the cell forming region is removed using an etching process. Then, using the photoresist mask 6A and the second oxide layer 5 on the control gate as the etch barriers, the exposed first polysilicon layer 3 is removed using etching. Consequently, a floating gate 15 is formed as shown in FIG. 1f, and then, the photoresist mask 6A is removed.

Thus, there are formed the gates for the cells of the semiconductor device using MOS transistors with floating gates, particularly, the non-volatile semiconductor memory device. Then, as shown in FIG. 1g, a BPSG layer 6 is deposited, and contact holes 8 are patterned using photoresist mask 7. Then, as shown in FIG. 1h, a metal wiring layer 9 is formed on the contact holes 8, thereby completing the non-volatile semiconductor memory device.

There are many advantages if as many cells as possible are formed on the same area, and therefore, the cell area needs to be utilized as efficiently as possible. However, a cell has one or more contacts, and a cell region which is formed as a matrix array cannot avoid having many contact regions. Therefore, a method to improve the formation of the contacts in the cell area is needed.

SUMMARY OF THE INVENTION

Accordingly, the present invention is directed to a method for forming a semiconductor device having a floating gate that substantially obviates one or more of the problems due to limitations and disadvantages of the related art.

An object of the present invention is to provide a method for forming a semiconductor device having a floating gate which utilizes the cell area efficiently.

Another object of the present invention is to provide a method for forming a semiconductor device having a floating gate with improved contact formation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the method for forming a semiconductor device having a floating gate of the present invention includes the steps of forming a first insulating layer and a first conductive layer on a surface of the substrate having an isolation region therein, patterning the first conductive layer on a cell forming area and implanting ions on the cell forming area for forming preliminary floating gate electrodes, forming a second insulating layer on the resulting surface and etching the second insulating layer so that the second insulating layer remains on a side wall of the preliminary floating gate electrode and to fill a space between preliminary floating gate electrodes, forming a third insulating layer on the resulting surface, forming a second conductive layer on the third insulating layer, forming a fourth insulating layer on the second conductive layer, forming a gate electrode by patterning the fourth insulating layer and the second conductive layer, wherein the gate electrode pattern has a wide distance between the gate lines in a portion to be a contact hole, and has a narrow distance between the gate lines in another portion, forming a floating gate electrode by patterning the third insulating layer and the second conductive layer using the gate electrode as mask, forming a source and drain region by ion implantation, forming a fifth insulating layer and anisotropically etching the fifth insulating layer for forming a contact hole, and filling the contact hole with a third conductive layer, and patterning the third conductive layer into wiring.

In another aspect, the method for forming of a semiconductor device having a transistor with a floating gate includes the steps of after forming a isolation region in the semiconductor substrate, forming an first insulating layer and a first conductive layer on the resulting surface of the substrate, forming a preliminary floating gate electrode by patterning the first conductive layer on a cell forming area, and implanting ions on the cell forming area, forming a second insulating layer on the resulting surface and etching the second insulating layer back so that it remains on the side wall of the preliminary floating gate electrodes, thus filling a space between the preliminary floating gate electrodes, forming a third insulating layer on the resulting surface, forming a second conductive layer on the third insulating layer, and forming a fourth insulating layer on the second conductive layer, forming a gate electrode by patterning the fourth insulating layer and the second conductive layer, wherein the gate electrode pattern is arranged in such a layout that a wide distance between the gate lines is arranged in a portion to be a contact hole, and a narrow distance between the gate lines is arranged in another portion, forming a floating gate electrode by patterning the third insulating layer and the second conductive layer using the gate electrode as mask, and forming a source and drain region by ion implantation, forming a fifth insulating layer and etching the fifth insulating layer back anisotropically, thus forming a contact hole, and filling with a third conductive layer in the contact hole, and patterning the third conductive layer into wiring.

A thickness of the second insulating layer may be greater than half of a length of a space between the preliminary floating gate electrodes. The fifth insulating layer may be deposited with a thickness greater than half of a length of a narrow distance between the gate electrodes but less than half of a length of a wide distance between the gate electrodes. The insulating layers may be formed of silicon oxide or silicon nitride, and conductive layers may be formed of polysilicon.

The present invention provides a method for forming a semiconductor device having a floating polysilicon gate using a cyclical arrangement of the contacts of a cell region, and the non-flat surface of a photoresist layer on a cell. The invention further utilizes a single mask in defining a contact region of a peripheral circuit portion through a photo etching process. This method forms cell elements in a cell forming region in a self-aligning manner, thereby reducing the area of each cell and the size of the cells.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 2E is a layout of a portion of a semiconductors device in accordance with the present invention between a peripheral circuit area B and memory cell area A;

FIG. 3 is a sectional view taken a long line a—a of FIG. 2E.

FIG. 7A and 7C are sectional views taken along line a—a, while

DESCRIPTION OF THE PREFERRED EMBODIMENTS

Reference will now be made in detail to the preferred embodiments of the present invention, examples of which are illustrated in the accompanying drawings.

Figure 1A:
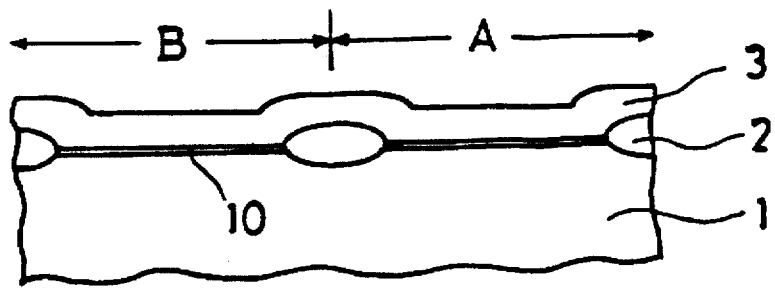
FIGS. 1a to 1h are illustrations of the process for forming a cell region and a peripheral circuit portion of the conventional semiconductor device using floating gates such as a non-volatile semiconductor memory device.
Figure 1B:
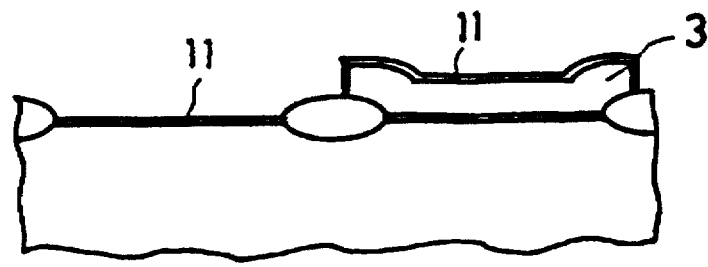
Figure 1C:
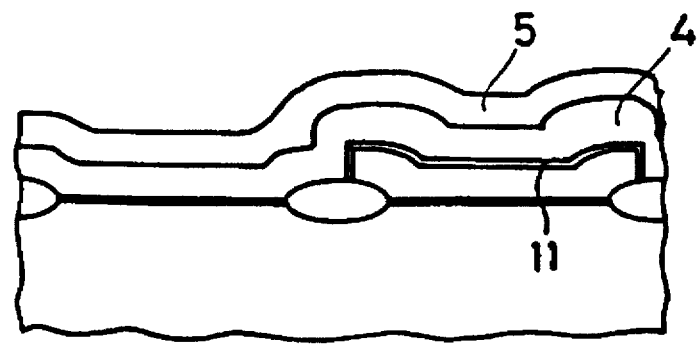
Figure 1D:
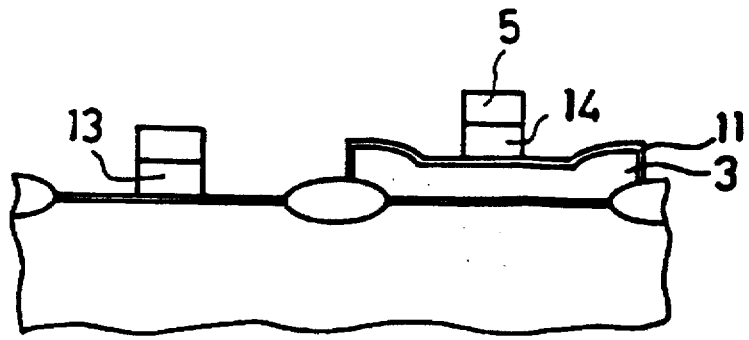
Figure 1E:
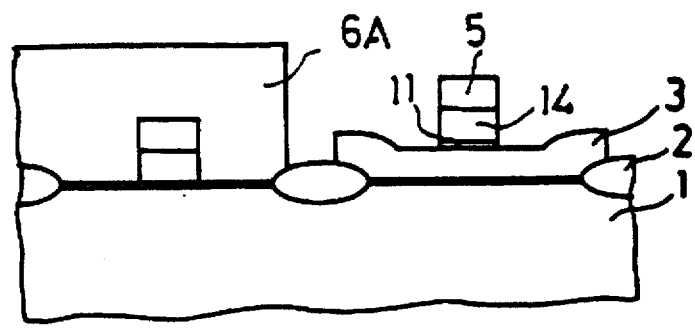
Figure 1F:
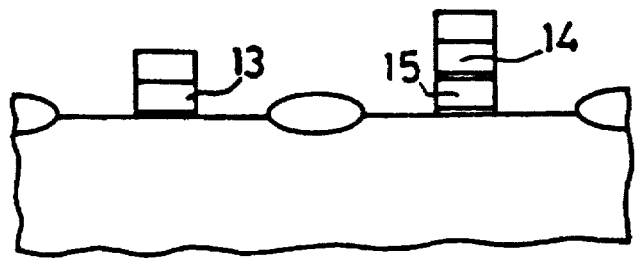
Figure 1G:
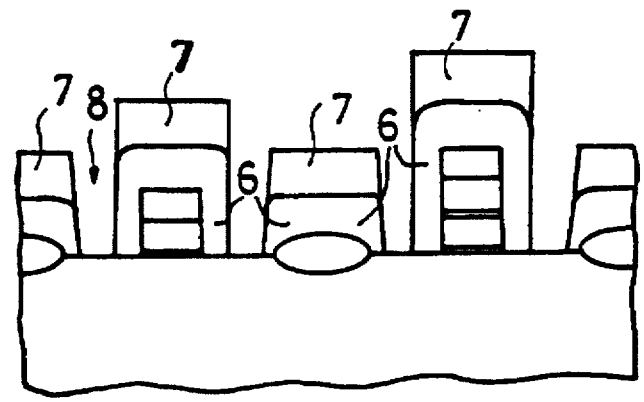
Figure 1H:
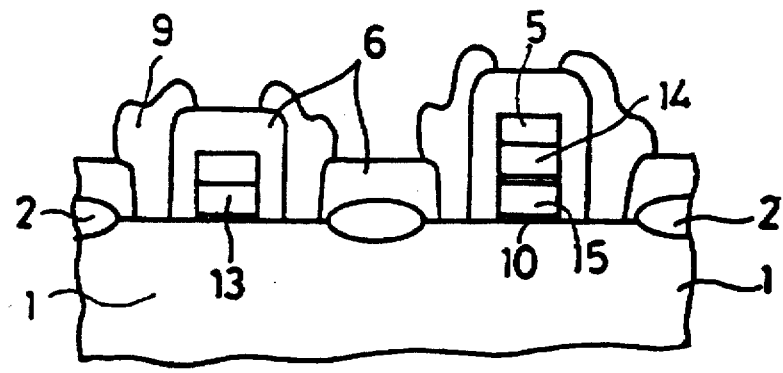
Figure 2A:
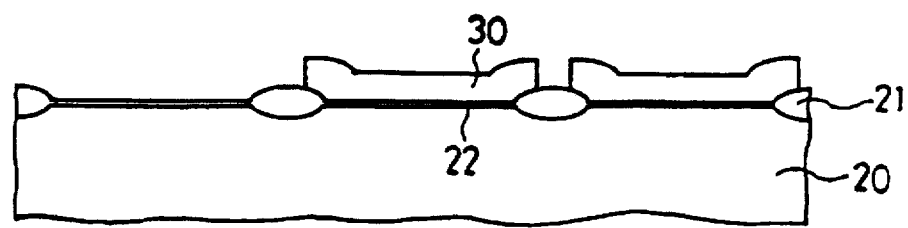
FIG. 2A is a partial sectional view of a semiconductors device in accordance with the present invention taken along the line a—a of FIG. 2E.
Figure 2B:
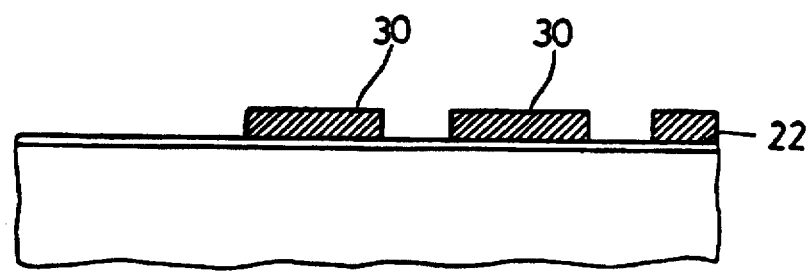
FIG. 2B is a partial sectional view of a semiconductors device in accordance with the present invention taken along the line b—b of FIG. 2E.
Figure 2C:
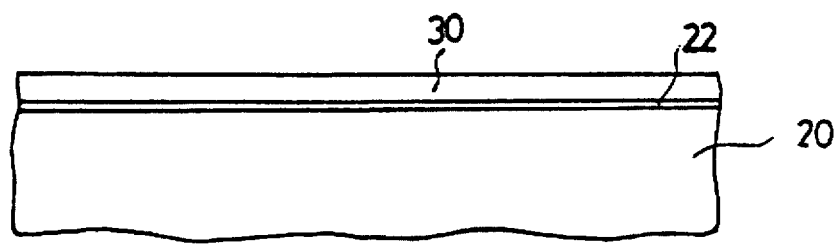
FIG. 2C is a partial sectional view of a semiconductors device in accordance with the present invention taken along the line c—c of FIG. 2E.
Figure 2D:
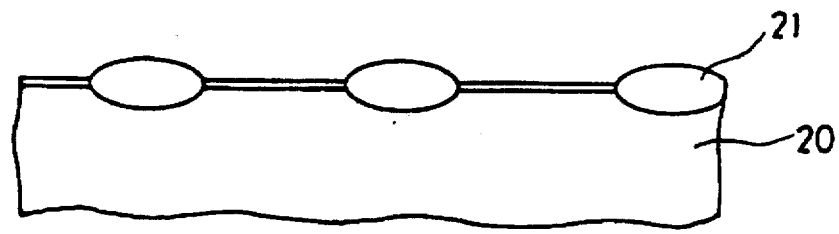
FIG. 2D is a partial sectional view of a semiconductors device in accordance with the present invention taken along the line d—d of FIG. 2E.

FIG. 2E illustrates a cell forming portion A and a peripheral circuit portion B. In the cell forming portion, cell elements of a cell region of the semiconductor device using floating gates are formed. Meanwhile, in the peripheral circuit forming portion, MOS transistors are typically formed. The formation process is carried out in the following manner.

As shown in FIGS. 2A to 2D, an isolating region (field oxide) 21 is formed in order to divide a semiconductor substrate into an active region and a field region. Thereafter, an insulating layer 22 (e.g. a first insulating layer) is formed on a semiconductor substrate 20. Then, a polysilicon layer (e.g. a first conductive layer) is formed thereon.

The polysilicon layer is then patterned using photolithography to form a preliminary floating gate electrode 30 which is shaped like a stripe. Since the polysilicon layer is not needed in the peripheral circuit portion, a portion of the polysilicon layer from the relevant portion is simultaneously removed.

Then, as shown in FIG. 3, which is a sectional view taken a long line a—a in FIG. 2E, a photoresist mask 24 is formed on the peripheral circuit portion B. Then, an $n^+$ type ion is implanted into the cell region A. Thus, the ions are implanted into the portion of the silicon substrate which is covered with only the insulating layer 22 (an area not covered by the photoresist mask 24) and the preliminary floating gate electrode. Then, photoresist mask 24 is removed. The ion implanted regions (doped regions) will form the impurity regions of the transistors. The doped impurity region is generally formed by carrying out an ion implantation similar to the conventional method.

Figure 4:
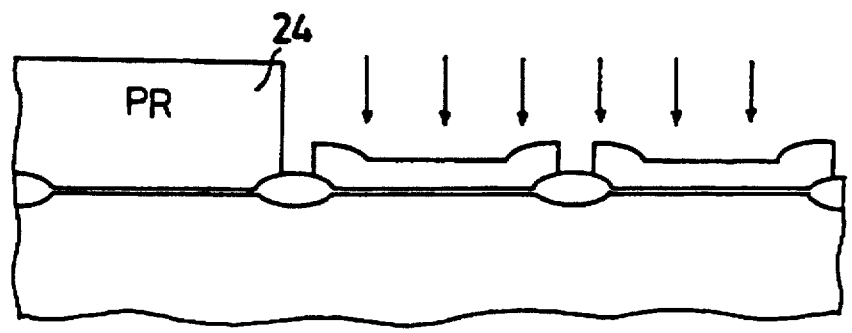
FIG. 4A is a partial sectional view taken along the line a—a of FIG. 2E.
FIG. 4B is a partial sectional view taken along the line b—b of FIG. 2E.
FIG. 4C is a partial sectional view taken along the line c—c in FIG. 2E.
FIG. 4D is a partial sectional view taken along the line d—d in FIG. 2E.
Figure 4A:
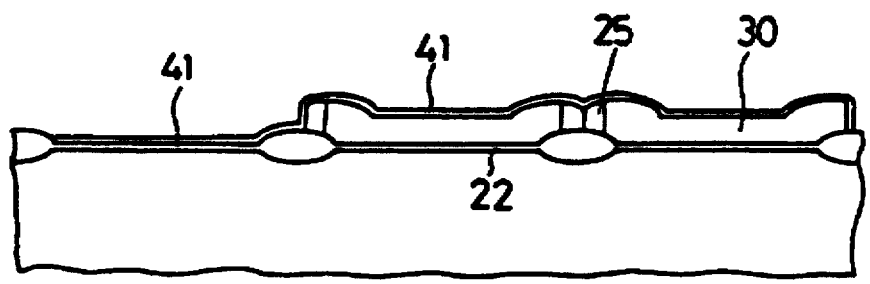
Figure 4B:
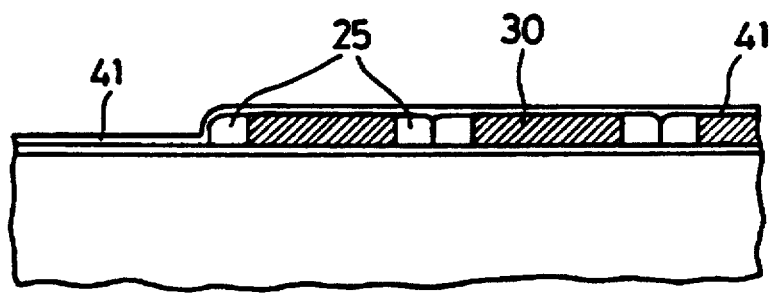
Figure 4C:
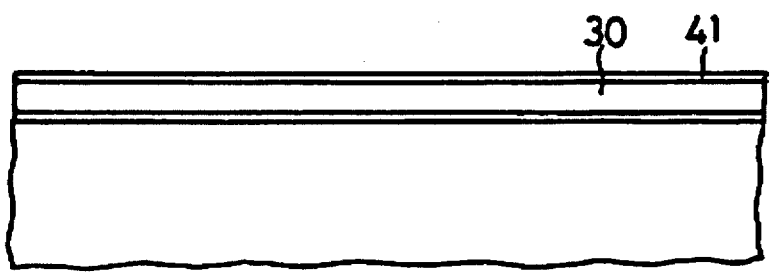
Figure 4D:
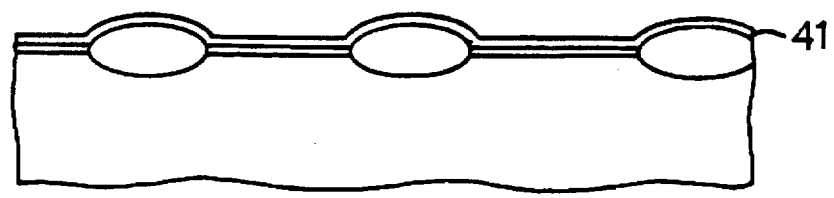

FIG. 4A is a partial sectional view taken along the line a—a of FIG. 2E, FIG. 4B is a partial sectional view taken along the line b—b of FIG. 2E, FIG. 4C is a partial sectional view taken along the line c—c of FIG. 2E, and FIG. 4D is a partial sectional view taken along the line d-d in FIG. 2E. As shown in FIGS. 4A to 4D, a chemical vapor deposition process is carried out to deposit an insulating layer, for example, $SiO_2$ or $Si_3N_4$, as a second insulating layer on the resulting surface of the substrate. Then, an anisotropic etching is carried out to form a side wall spacer 25 composed of a portion of the second insulating layer between the preliminary floating gate electrodes 30. The thickness of the second insulating layer should be more than ½ of the interval between the preliminary floating gate electrodes 30.

Then, an oxide layer 41 (e.g. as a third insulating layer) is formed on the preliminary floating gate electrode 30 and on the resulting surface, so that the oxide layer 41 can serve as a dielectric layer.

Figure 5:
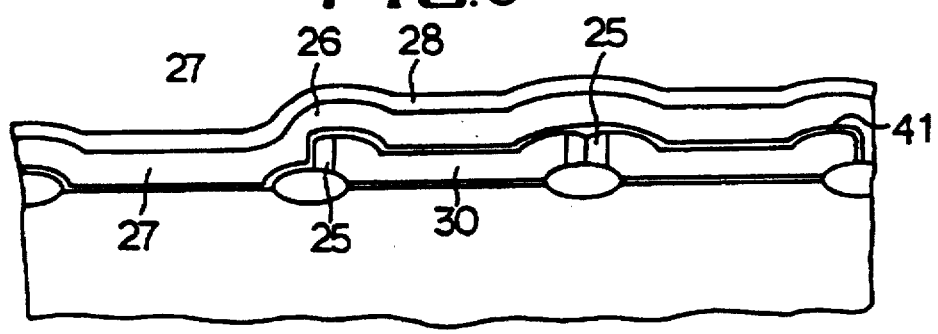
FIG. 5 is a sectional view taken along line a—a of FIG. 2E.
Figures 6, 6A:
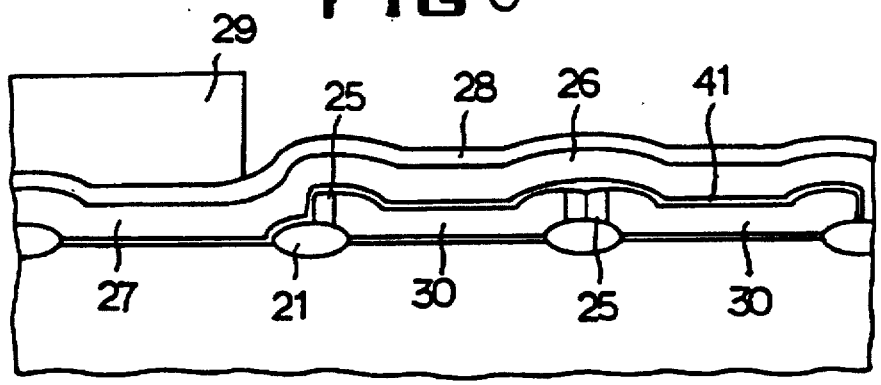
FIG. 6A is a partial sectional view taken along the line a—a of FIG. 6E.
Figure 6B:
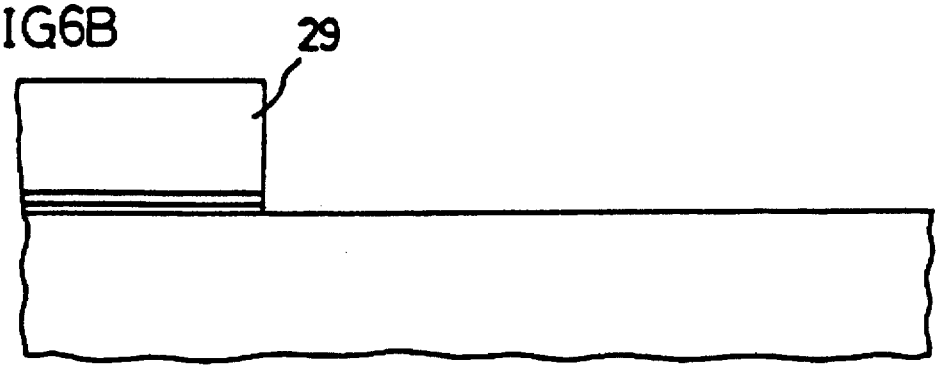
FIG. 6B is a partial sectional view taken along the line b—b of FIG. 6E.
Figure 6C:
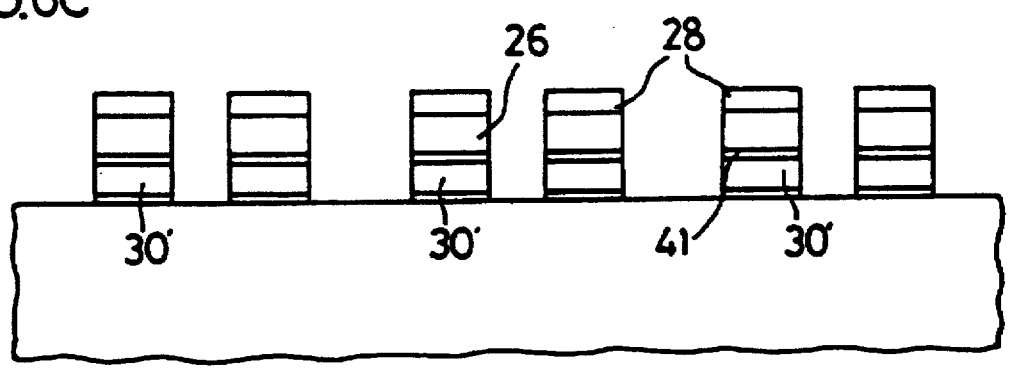
FIG. 6C is a partial sectional view taken along the line c—c of FIG. 6E.
Figure 6D:
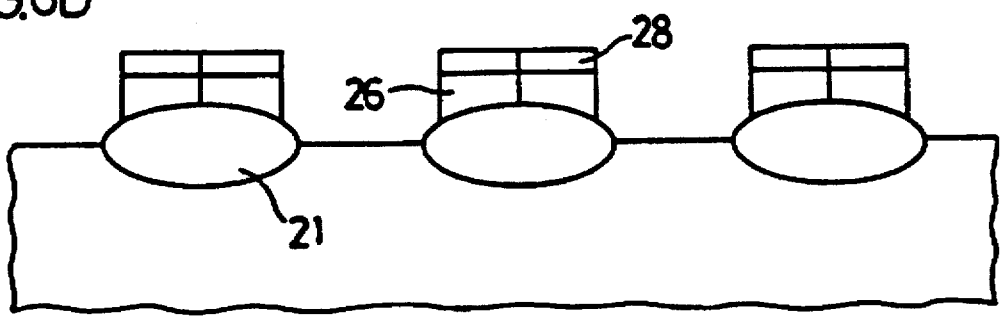
FIG. 6D is a partial sectional view taken along the line d—d of FIG. 6E.
Figure 6E:
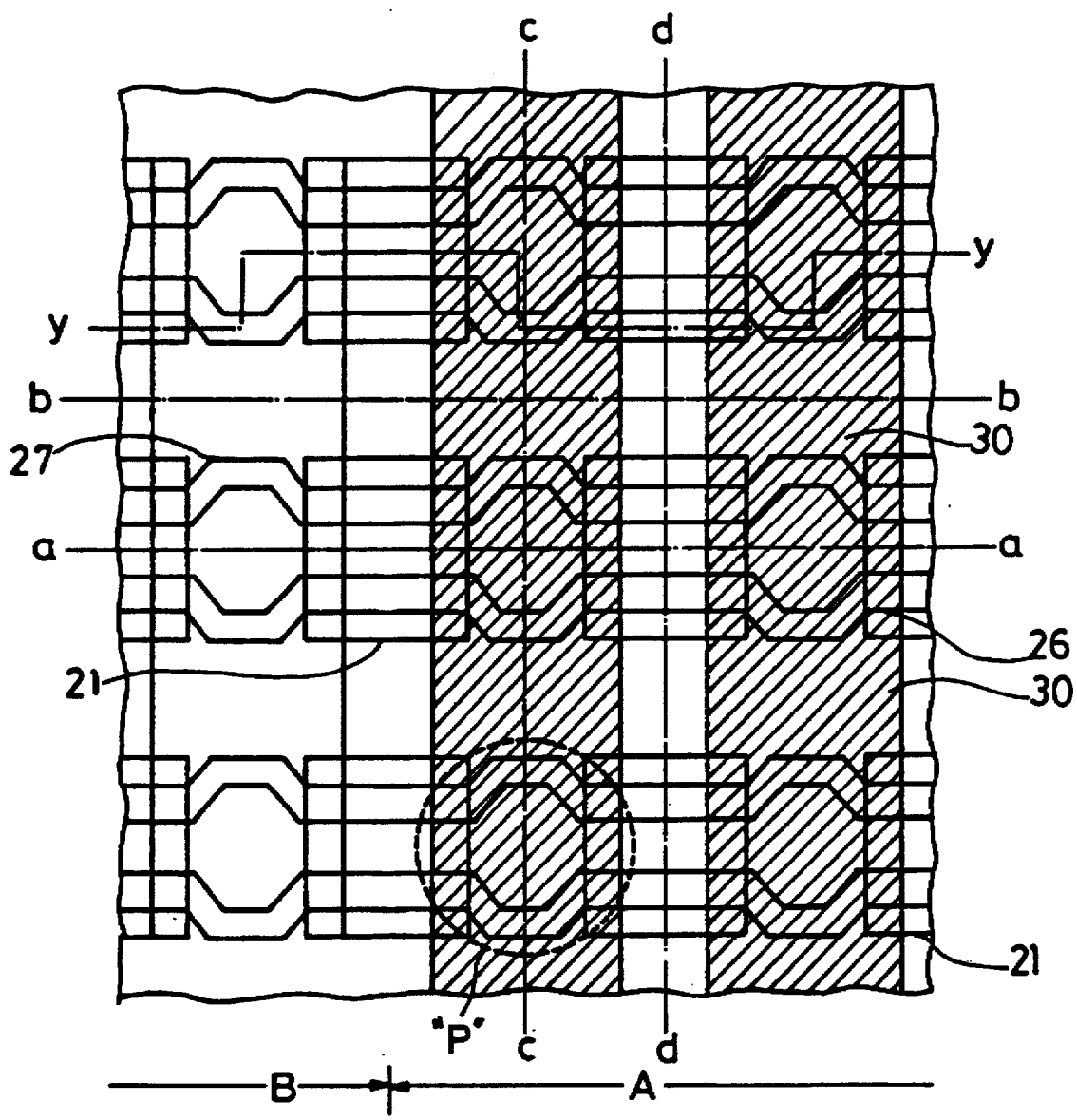
FIG. 6E is a layout of a portion between a peripheral circuit area B and memory cell area A corresponding to FIG. 2E.

FIG. 5 is a sectional view taken along line a—a of FIG. 2E, FIG. 6E is a layout of a portion between a peripheral circuit area B and memory cell area A corresponding to FIG. 2E, FIG. 6A is a partial sectional view taken along the line of gate electrodes 26 and 27, FIG. 6B is a partial sectional view taken along the line b—b of FIG. 6E, and FIG. 6C is a partial sectional view taken along the line c—c of FIG. 6E. FIG. 6D is a partial sectional view taken along the line d—d of FIG. 6E. As shown in FIG. 5 and FIGS. 6A to 6D, a polysilicon layer 26,27 (a second conductive layer) and a fourth insulating layer 28 are formed on the resulting surface of the substrate. A control gate 26 for the memory cells, and a gate electrode 27 for the MOS device of the peripheral circuit portion are formed by photo-etching the fourth insulating layer and the second conductive layer. Thus, a gate electrode pattern 27 and 26 including the insulating layer 28 and polysilicon layer 26,27 is formed in such an arrangement that a mask for patterning gate lines (word lines) is made having relatively wide gaps for the region in which the contacts are formed in a self-aligning form, meanwhile, the mask is made to have relatively narrow gaps for the region in which no contact is formed. In other words, the work lines are patterned to have a separation in regions where a contact is to be formed that is wider than in regions where no contacts are to be formed.

FIG. 7 illustrates the above described process in further detail. FIG. 7E is a plan view of the part indicated by "P" in FIG. 6E, FIGS. 7A and 7C are sectional views taken along a line a—a, and FIGS. 7B and 7D are sectional views taken along a line b—b of FIG. 7E.

Figure 7A:
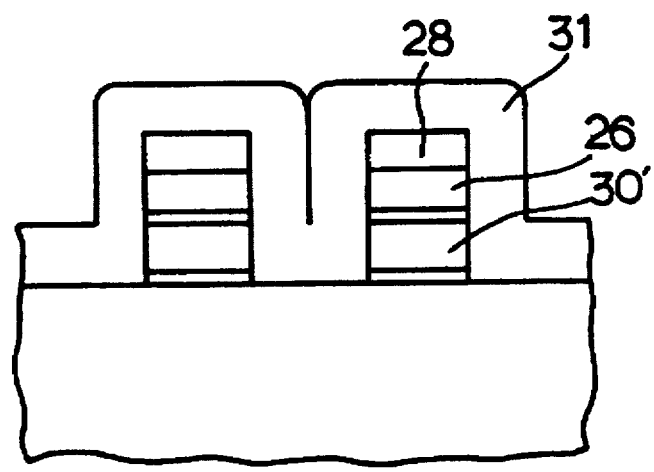
Figure 7B:
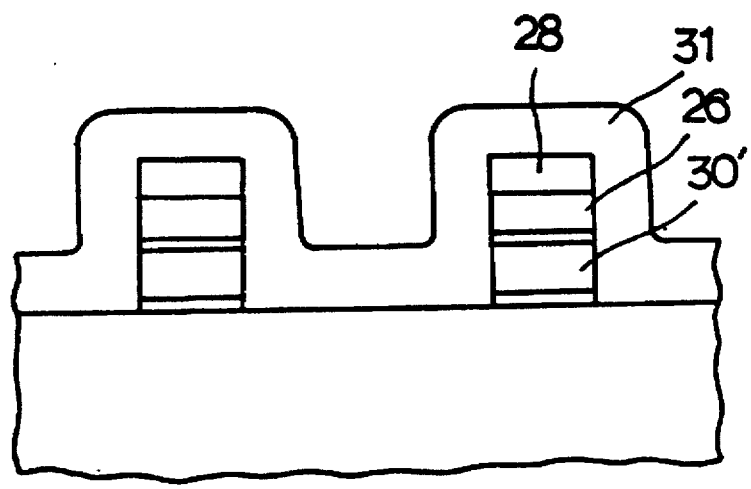
FIG. 7B and 7D are sectional views taken along line b—b of FIG. 7E.
Figure 7C:
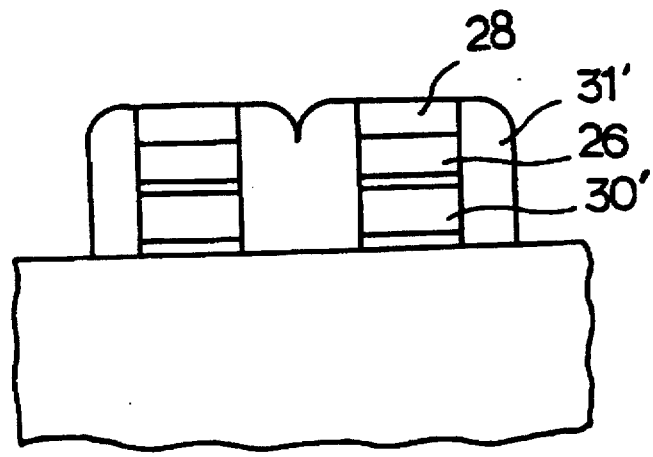
Figure 7D:
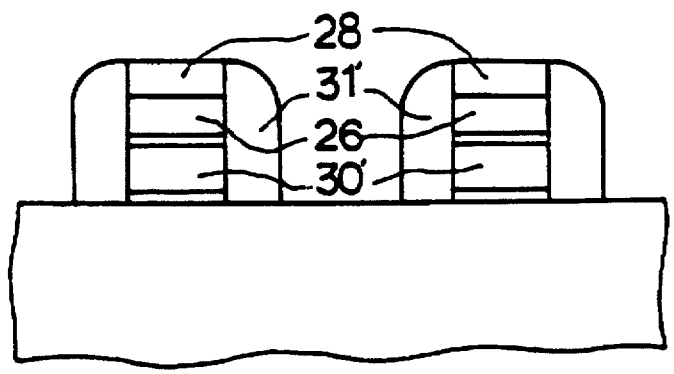
Figure 7E:
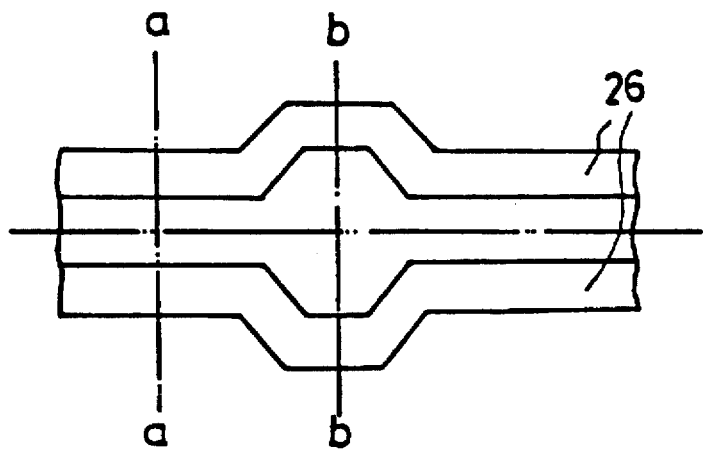
FIG. 7E is a plan view of the portion indicated by "P" of FIG. 6E.

If an oxide layer 31 is deposited on the resulting surface on FIGS. 6, then an sectional view is like the states of FIG. 7A and 7B. If an anisotropic etching is carried out on the oxide layer 31, then a resulting sectional view is like the states of FIG. 7C and 7D.

As can be seen in FIGS. 7, if a distance between the gate line patterns 26,30' is narrow, then no contact hole is formed. However, as shown in FIG. 7D, if a distance between the gate line is wide, then side walls 31' are formed, so that contact holes are formed between them.

Again as shown in FIGS. 6, the peripheral circuit portion is masked by means of the photoresist mask layer 29, and then, an exposed portion of the third insulating layer 41 of the cell forming region is removed by etching. And by using the fourth insulating layer 28 which lies upon the control gate 26 and the photoresist mask 29 as the etch barrier, the preliminary floating gate electrode 30 is removed by etching process, so that floating gates 30' are formed. Then, the photoresist mask layer 29 is removed.

Figure 8:
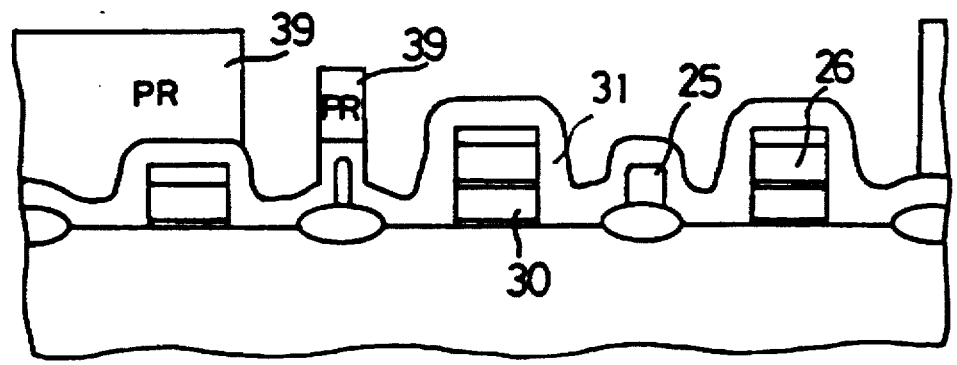
FIGS. 8, 9, and 10 are partial sectional views taken along line Y—Y of FIG. 6E.
Figure 9:
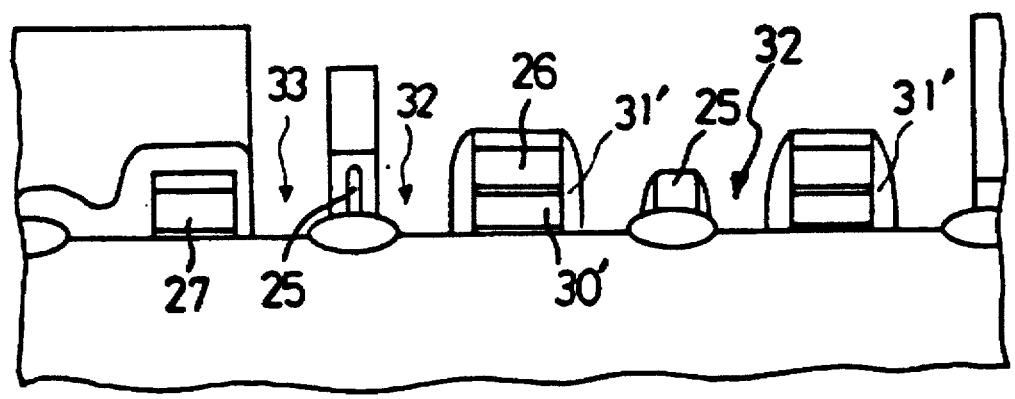
Figure 10:
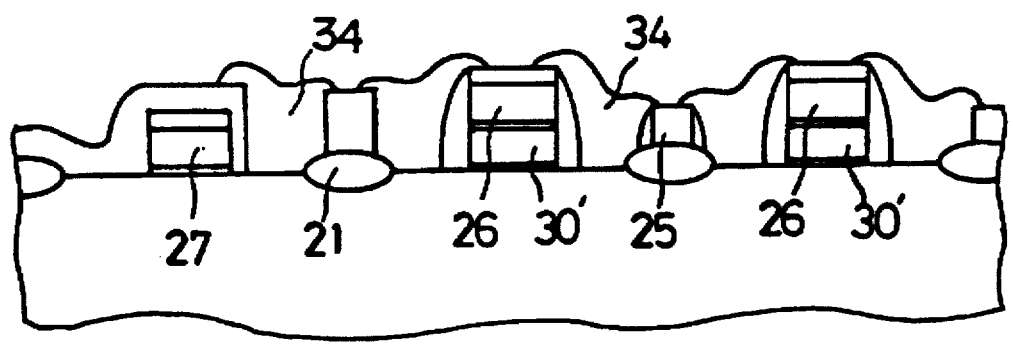

FIGS. 8, 9, and 10 are partly sectional views taken along line Y—Y of FIG. 6E.

As a next step, as shown in FIG. 8, a BPSG layer 31 as a fifth insulating layer is deposited upon the resulting surface of the substrate, and a photoresist pattern PR 39 is formed. This photoresist pattern 39 covers a region other than the cell region and the contact forming region. In other words, the pattern 39 opens contact forming region and memory cell region. In FIG. 8, the exposed portion of the peripheral circuit portion corresponds to the contact forming region.

Then as shown in FIG. 9, the exposed portion of the BPSG layer 31 is dry-etched. Consequently, in the cell region, an insulating spacer 31' is formed on the side wall of the gate, and the contact forming region is opened and between the side wall spacers 31' becomes a tiny contact region 32. Accordingly in the peripheral circuit portion, contact holes 33 are formed using a mask.

When carrying out a photo etching process for forming a contact region of the peripheral circuit portion, a small contact hole is formed in the cell region by arranging the gate electrode by means of the side wall spacer without a mask pattern. Therefore, the size of the memory cells region is reduced.

After the contact region is formed for the cells, the photoresist pattern PR 39 is removed. Then as shown in FIG. 10, a third conductive layer is formed to fill in the contact holes, and the third conductive layer is patterned into wiring lines or wiring plugs.

According to the present invention as described above, during the photo etching process for the formation of the contact region, only a single mask is used to define the contact region of the peripheral circuit portion. Meanwhile, in the cell region, a miniaturization is achieved in a self aligning manner. Therefore, the area occupied by a cell is reduced, so that the size of cell is also reduced in forming a semiconductor device using floating polysilicon gates, particularly, a non-volatile semiconductor memory device.

It will be apparent to those skilled in the art that various modifications and variations can be made in the method for forming a semiconductor device having a floating gate of the present invention without departing from the spirit or scope of the invention. Thus, it is intended that the present invention cover the modifications and variations of this invention provided they come within the scope of the appended claims and their equivalents.

What is claimed is:

1. A method for forming of a semiconductor device including a transistor having a floating gate, comprising the steps of:
   (a) forming a first insulating layer and a first conductive layer on a surface of the substrate;
   (b) patterning the first conductive layer on a cell forming area for forming preliminary floating gate electrodes spaced by a distance and implanting ions on the cell forming area;
   (c) forming a second insulating layer on the resulting surface formed after step (b) and etching the second insulating layer so that the second insulating layer remains on a side wall of the preliminary floating gate electrodes and fills the distance between preliminary floating gate electrodes;
   (d) forming a third insulating layer on the resulting surface formed after step (c);
   (e) forming a second conductive layer on the third insulating layer;
   (f) forming a fourth insulating layer on the second conductive layer;
   (g) forming gate electrode patterns by patterning the fourth insulating layer and the second conductive layer, wherein the gate electrode patterns have a first distance between the gate patterns in a portion to be a contact hole, and a second distance between the gate patterns is arranged in another portion, the first distance being wider than the second distance;
   (h) forming a floating gate electrode by patterning the third insulating layer and the preliminary floating gate electrodes using the gate electrode patterns as a mask;
   (i) forming source and drain regions by ion implantation;
   (j) forming a fifth insulating layer and anisotropically etching the fifth insulating layer for forming a contact hole; and
   (k) filling the contact hole with a third conductive layer, and patterning the third conductive layer into wiring.

2. The method according to claim 1, in step (c), a thickness of the second insulating layer is thicker than a half length of the distance between the preliminary floating gate electrodes.

3. The method according to claim 1, in step (j), the fifth insulating layer is deposited with a thickness which is greater than a half length of the second distance between the gate electrode patterns and less than a half length of the first distance between the gate electrode patterns.

4. The method according to claim 1, wherein the etching process in step (j) includes steps of forming a photoresist mask which covers a peripheral circuit portion except for the contact hole and does not cover the cell forming area, etching the fifth insulating layer until a portion of the fifth insulating layer on a horizontal surface is removed so that a portion of the fifth insulating layer remains on a side wall of the gate electrode patterns.

5. The method according to claim 1, wherein in step (b), the ion implanting is performed with a photoresist mask which covers a peripheral circuit portion.

6. The method according to claim 1, wherein the first through fifth insulating layers are at least each formed of one of silicon oxide and silicon nitride, and the first, second and third conductive layers are formed of polysilicon.

7. A method for forming of a semiconductor device including a transistor having a floating gate, comprising the steps of:
   (a) forming a first insulating layer and a first conductive layer on a surface of the substrate;
   (b) patterning the first conductive layer on a cell forming area to form preliminary floating gate electrodes spaced by a distance and implanting ions on the cell forming area;
   (c) forming a second insulating layer on the resulting surface formed after step (b) so that the second insulating layer fills the distance between the preliminary floating gate electrodes;
   (d) forming a third insulating layer on the resulting surface formed after step (c);
   (e) forming a second conductive layer on the third insulating layer;
   (f) forming a fourth insulating layer on the second conductive layer;
   (g) forming gate electrode patterns by patterning the fourth insulating layer and the second conductive layer, wherein the gate electrode patterns have a first distance between the gate patterns in a portion to be a contact hole, and a second distance between the gate patterns is arranged in another portion, the first distance being wider than the second distance; and
   (h) forming a floating gate electrode by patterning the third insulating layer and the preliminary floating gate electrodes.

8. The method according to claim 7, further comprising the steps of:
   (i) forming a source and drain region by ion implantation;
   (j) forming a fifth insulating layer and anisotropically etching the fifth insulating layer for forming a contact hole; and
   (k) filling the contact hole with a third conductive layer, and patterning the third conductive layer into wiring.

9. The method according to claim 8, wherein in step (c), a thickness of the second insulating layer is thicker than a half length of the distance between the preliminary floating gate electrodes.

10. The method according to claim 8, in step (j), the fifth insulating layer is deposited with a thickness which is greater than a half length of the second distance between the gate electrodes and less than a half length of the first distance between the gate electrodes.

11. The method according to claim 8, wherein the etching process in step (j) includes steps of forming a photoresist mask which covers a peripheral circuit portion except for the contact hole and does not cover the cell forming area, etching the fifth insulating layer until a portion of the fifth insulating layer on a horizontal surface is removed so that a portion of the fifth insulating layer remains attached on a side wall of the gate patterns.

12. The method according to claim 7, wherein in step (b), the ion implanting is performed with a photoresist mask which covers a peripheral circuit portion.

13. The method according to claim 7, wherein the substrate has an isolation region therein.

14. The method according to claim 7, wherein step (h) uses the gate electrode as a mask.

15. A method for forming of a semiconductor device including a transistor having a floating gate, comprising the steps of:

(a) after forming a isolation region in the semiconductor substrate, forming a first insulating layer and a first conductive layer on the resulting surface of the substrate;

(b) forming preliminary floating gate electrodes by patterning the first conductive layer on a cell forming area, and implanting ions on the cell forming area;

(c) forming a second insulating layer on the resulting surface formed after step (b) and etching the second insulating layer back so that it remains on the side walls of the preliminary floating gate electrodes, thus filling the distance between the preliminary floating gate electrodes;

(d) forming a third insulating layer on the resulting surface formed after step (c), forming a second conductive layer on the third insulating layer, and forming a fourth insulating layer on the second conductive layer;

(e) forming gate electrode patterns by patterning the fourth insulating layer and the second conductive layer, wherein the gate electrode patterns are arranged in such a layout that a wide distance between the gate patterns is arranged in a portion to be a contact hole, and a narrow distance between the gate patterns is arranged in another portion;

(f) forming a floating gate electrode by patterning the third insulating layer and the second conductive layer using the gate electrode as mask, and forming a source and drain region by ion implantation;

(g) forming a fifth insulating layer and etching the fifth insulating layer back anisotropically, thus forming a contact hole; and (h) filling the cantact hole with a third conductive layer, and patterning the third conductive layer into wiring.

16. The method according to claim 15, in step (c), the thickness of the second insulating layer is to be thicker than a half length of the distance between the preliminary floating gate electrodes.

17. The method according to claim 15, in step (g), the fifth insulating layer is deposited with a thickness which is thicker than a half length of the narrow distance between the gate electrodes and thinner than a half length of the wide distance between the gate electrodes.

18. The method according to claim 15, wherein the etching process of step (g) includes steps for forming a photoresist mask which covers a peripheral circuit portion except for the contact hole and does not cover the cell forming area, etching the fifth insulating layer until a portion of the fifth insulating layer on a horizontal surface is removed, thus leaving a portion of the fifth insulating layer on side walls of the gate patterns.

19. The method according to claim 15, wherein the ion implanting of step (b) is performed with a photoresist mask which covers a peripheral circuit portion.

20. The method according to claim 15, wherein the first, second, third, fourth and fifth insulating layers are formed of silicon oxide or silicon nitride, and the first, second, and third conductive layers are formed of polysilicon.

* * * * *